United States Patent [19]

Yuan

[11] 3,839,104

[45] Oct. 1, 1974

[54] FABRICATION TECHNIQUE FOR HIGH PERFORMANCE SEMICONDUCTOR DEVICES

[75] Inventor: Han-Tzong Yuan, Dallas, Tex.

[73] Assignee: Texas Instruments Incorporated, Dallas, Tex.

[22] Filed: Aug. 31, 1972

[21] Appl. No.: 285,281

[52] U.S. Cl. ................. 148/188, 148/187, 148/189, 148/191, 317/235 R

[51] Int. Cl. .............................................. H01l 7/44

[58] Field of Search ........... 148/188, 187, 189, 191, 148/186; 317/235 Y, 235 WW

[56] References Cited

UNITED STATES PATENTS

| | | | |
|---|---|---|---|
| 3,476,619 | 11/1969 | Tolliver | 148/187 |
| 3,607,468 | 9/1971 | Chang et al. | 148/186 |
| 3,615,942 | 10/1971 | Blumenfeld et al. | 148/187 |
| 3,635,773 | 1/1972 | Thire | 148/191 |
| 3,664,896 | 5/1972 | Duncan | 148/187 |

*Primary Examiner*—G. Ozaki
*Attorney, Agent, or Firm*—Harold Levine; James T. Comfort; Gary C. Honeycutt

[57] ABSTRACT

Microwave and pico-second switching transistors are fabricated by a process which includes (1) selective in-diffusion combined with selective out-diffusion to form three resistance levels in the base region; (2) composite diffusion masking for self-alignment of the base contact and emitter locations; and (3) the use of an arsenic-doped oxide diffusion source for the formation of emitter regions prior to doping the base contact locations.

4 Claims, 7 Drawing Figures

FABRICATION TECHNIQUE FOR HIGH PERFORMANCE SEMICONDUCTOR DEVICES

Figure 4:
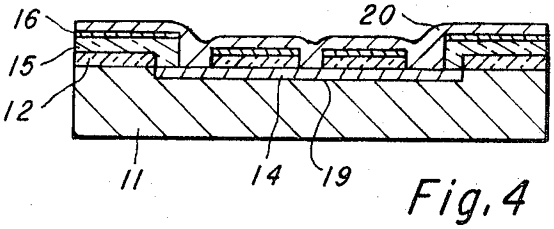

This invention relates to the fabrication of high performance semiconductor devices including particularly microwave transistors and picosecond switching transistors. The devices have improved performance characteristics including particularly higher frequency operation, a lower noise factor, and reduced base resistance.

The typical microwave transistor process employing boron-phosphorus double diffusion is generally known to involve three basic problems which limit device performance. Firstly, the boron base diffusion must be designed to compromise between base width, base resistance and contact resistance. Secondly, the small geometry is extremely difficult to define. Even with self-alignment masking techniques the process complexity often results in low yields. Thirdly, the "emitter push" effect associated with phosphorus diffusion prevents the fabrication of very thin base transistors, thus inhibiting the frequency performance.

Accordingly, it is an objective of the present invention to provide an integral fabrication process which permits independent control of the base resistance at three critical portions of the base regions; and which simplifies the application of self-alignment techniques by reducing the photolithography steps from six to four.

It is a further object of the invention to provide a process which can easily incorporate either arsenic or phosphorous emitter diffusion.

The stated invention begins with the deposition of a suitable dopant of one conductivity type (for example, boron in the case of n-p-n transistors) on a selected portion of a semiconductor surface of the opposite conductivity type. Then, prior to the drive-in, a composite diffusion mask is patterned on the doped region, having an aperture therein to define both the emitter and base contact opening. Thus, during the subsequent drive-in at diffusion temperatures, selective out-diffusion occurs through the mask aperture, thereby controlling the doping level locally, while the sheet resistance remains essentially unchanged beneath the mask. In the fabrication of microwave or picosecond switching transistors (where low base resistance is important), for example, this technique permits an independent control over base resistance between the emitter and the base contacts without imposing constraint on the base diffusion beneath the emitter.

In addition to the above features which solve the base resistance problem and the emitter push problem, another preferred embodiment of the invention includes a simplified photolithographic process in applying the self-alignment masking techniques. The use of doped oxide for the emitter diffusion source, as well as for diffusion masking for later processes, greatly simplifies the photolithographic steps for high frequency, micron-geometry transistor processing. As stated above, the total photolithographic definition steps are reduced to only base, composite masking, base contact and metal contact, compared with other self-alignment processes where six photolithographic steps are required.

Subsequently, a doped oxide with dopant suitable for emitter diffusion is applied to the slice. After emitter diffusion with the doped oxide masking the emitter opening, a low resistivity, high surface concentration dopant is added at the base contact location immediately before metal contact is applied, thus achieving consistent low ohmic contact for the transistor.

In accordance with a preferred embodiment of the invention, the above features are combined with the use of arsenic diffusion, instead of phosphorous, to form the emitter and thereby avoid emitter push. Consequently, the spacing between the emitter junction and the base junction can reliably and reproducibly be narrowed to about one-tenth of a micron.

FIGS. 1-7 are enlarged cross-sectional views of a semiconductor wafer, illustrating the sequence of process steps employed in accordance with one embodiment of the invention.

Figure 1:
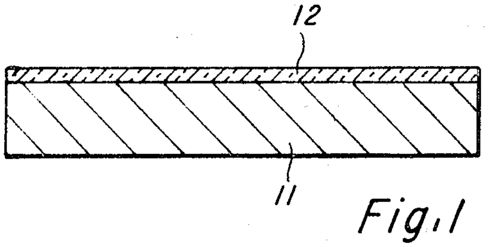
Figure 2:
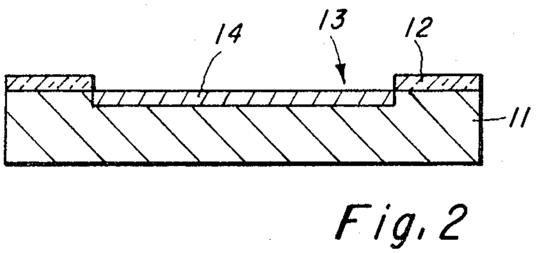

As shown in FIG. 1, a monocrystalline silicon slice 11 of n-type conductivity is oxidized in accordance with known techniques to provide a layer 12 of silicon oxide having a sufficient thickness to be used as a selective diffusion mask. In FIG. 2 the wafer of FIG. 1 is shown after the patterning of oxide layer 12 in accordance with known methods to provide a window 13 defining the base region, wherein a suitable impurity is deposited for diffusion of the base region. For example, the slice is exposed to a vaporous boron compound at a temperature of 850°C for 15 to 20 minutes. After deglazing to remove excess boron glass, boron-doped region 14 remains in the silicon surface.

Figure 3:
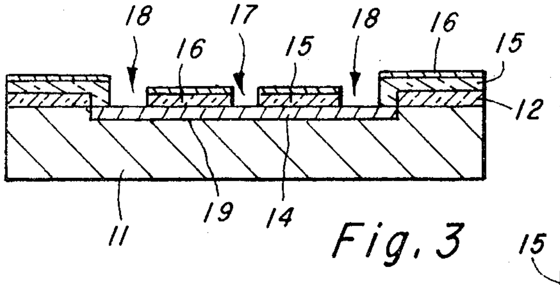

As shown in FIG. 3, a second selective diffusion mask is formed on the slice, covering the base window, consisting of a deposited silicon oxide layer 15 and a deposited silicon nitride layer 16. Windows 17 and 18 in the second diffusion mask define the emitter and the base contact locations, respectively. The slice is then subjected to a diffusion temperature of, for example, about 900°C for a time sufficient to out-diffuse boron through windows 17 and 18, thereby controlling the dopant at these selected locations to provide the optimized base structure required in accordance with the invention. Concurrently, the boron impurity located under the mask between windows 17 and 18 can only have in-diffusion, thereby retaining the low resistivity which results from initial deposition 14. Normally, after the base diffusion step to form junction 19, the sheet resistance at the window locations can differ from the sheet resistance beneath the mask by a factor of about 3 or more. For example, a sheet resistance in excess of 1,000 ohms per square has been obtained at the window locations, compared to a sheet resistance of about 350 ohms per square beneath the mask.

Figure 5:
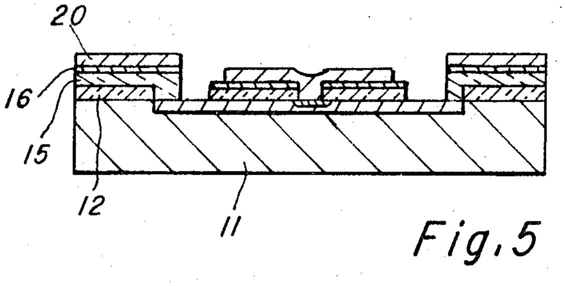

As shown in FIG. 4, the slice is then coated with an arsenic-doped silicon oxide layer 20 covering the nitride layer 16 and filling windows 17 and 18. Layer 20 is formed by known methods, such as by contacting the wafer with a vaporous stream containing tetraethylorthosilicate (TEOS) and arsine ($AsH_3$) at a temperature of about 550° to 650°C, for example, for a time sufficient to deposit about 1,500 to 2,500 angstroms of doped oxide. In FIG. 5 the slice is shown after selective removal of the arsenic-doped oxide from window locations 18 while retaining arsenic-doped oxide in emitter window 17. The slice is then heated to a diffusion temperature of about 1,000°C for 15 minutes, for example, to form the emitter at location 17. Concurrently, out-diffusion of boron occurs from windows 18. With the arsenic-doped oxide still in the emitter window, the slice is then placed in a vaporous stream of a suitable boron compound, such as $BBr_3$, for example, at a temperature of 900°–950°C, for example, to prepare high-conductivity locations in the base region for ohmic contacts.

Figure 6:
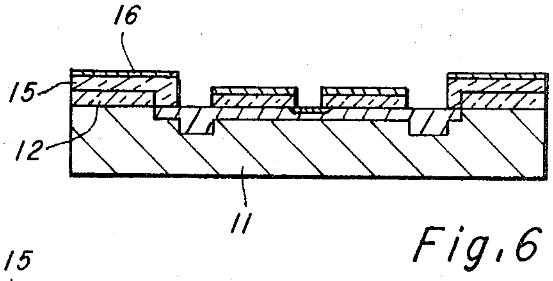
Figure 7:
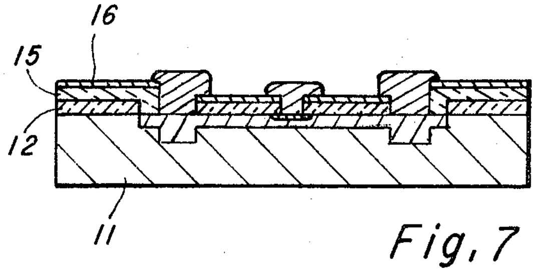

As shown in FIG. 6, the arsenic-doped oxide is then stripped from the slice using a suitable etchant such as buffered aqueous HF which does not appreciably attack nitride layer 16. A metallization film is then deposited on the slice, and patterned to form base and emitter contacts as shown in FIG. 7. Of course, a collector contact is also provided, but is not shown in the drawings.

Transistors made by the above-described sequence of steps include the following characteristics:

DC characteristics:

Reverse breakdown voltage, emitter to base, collector open $V_{ebo} = 30$ volts at 10 microamps Reverse breakdown voltage, emitter to collector, base open $V_{eco} = 25$ volts at 100 microamps Current gain, common emitter $h_{FE} = 40$ or 50 at 3 milliamps, 10 volts RF characteristics at 2 GHz:

Maximum gain $G_{max} = 12.5$ db

Noise = 3.4 db

Current gain bandwidth, common emitter $f_T = 10.5$ GHz (Base resistance) (Collector-base capacitance) $R_bC_c = 1.20$ ps

What is claimed is:

1. A method for the fabrication of a semiconductor device comprising the steps of:

a. patterning a first diffusion mask on a semiconductor surface of one conductivity type to selectively expose and define a first surface region thereof;

b. depositing a suitable conductivity-type-determining impurity on said first surface region for subsequent redistribution to form a p-n junction;

c. patterning a second diffusion mask on said first surface region to selectively expose at least two discrete locations thereon;

d. redistributing said impurity in the semiconductor surface while out-diffusing a substantial portion of said impurity selectively from at least one of said discrete locations;

e. covering said out-diffused discrete location with an adherent layer of dielectric material containing an impurity of said one conductivity type;

f. introducing said impurity of said one type into the semiconductor from said doped dielectric material;

g. introducing an impurity of the opposite conductivity type into the semiconductor at one or more of said discrete locations not covered by said doped dielectric material;

h. removing said doped dielectric from said discrete location; and i. forming ohmic contacts to the semiconductor at said discrete locations.

2. A method as in claim 1 wherein said semiconductor is silicon, said first diffusion mask is silicon oxide, and said second diffusion mask comprises silicon oxide and nitride.

3. A method as in claim 2 wherein said second diffusion mask comprises a layer of silicon oxide and a layer of silicon nitride.

4. A method as in claim 1 wherein said semiconductor is silicon, and wherein said adherent layer of dielectric material containing impurities of said one conductivity type comprises arsenic-doped silicon oxide.

* * * * *